United States Patent
Obata

(10) Patent No.: US 9,679,789 B2
(45) Date of Patent: Jun. 13, 2017

(54) WAFER PROCESSING APPARATUS

(71) Applicant: DISCO CORPORATION, Tokyo (JP)

(72) Inventor: Tsukuru Obata, Tokyo (JP)

(73) Assignee: Disco Corporation, Tokyo (JP)

( * ) Notice: Subject to any disclaimer, the term of this patent is extended or adjusted under 35 U.S.C. 154(b) by 189 days.

(21) Appl. No.: 14/556,881

(22) Filed: Dec. 1, 2014

(65) Prior Publication Data

US 2015/0162222 A1  Jun. 11, 2015

(30) Foreign Application Priority Data

Dec. 9, 2013  (JP) ................. 2013-254067

(51) Int. Cl.
  *H01L 21/304*  (2006.01)
  *H01L 21/78*  (2006.01)
  *H01L 21/67*  (2006.01)
  *H01L 21/02*  (2006.01)

(52) U.S. Cl.
  CPC .. *H01L 21/67057* (2013.01); *H01L 21/02076* (2013.01); *H01L 21/304* (2013.01); *H01L 21/67092* (2013.01); *H01L 21/78* (2013.01)

(58) Field of Classification Search
  None
  See application file for complete search history.

(56) References Cited

U.S. PATENT DOCUMENTS

| 4,127,969 A * | 12/1978 | Hoshi | B28D 5/0058 257/E21.214 |
| 2007/0141810 A1* | 6/2007 | Nakamura | B23K 26/0057 438/460 |
| 2011/0056512 A1* | 3/2011 | Sato | B08B 3/12 134/1 |

FOREIGN PATENT DOCUMENTS

| JP | 2002-192367 | 7/2002 | |
| JP | 2002192367 A * | 7/2002 | |
| JP | 2005-135964 | 5/2005 | |
| KR | 100934012 B1 * | 12/2009 | ....... H01L 21/67092 |

* cited by examiner

*Primary Examiner* — Michael Barr
*Assistant Examiner* — Cristi Tate-Sims
(74) *Attorney, Agent, or Firm* — Greer Burns & Crain Ltd.

(57) ABSTRACT

A wafer in which a modified layer is internally formed along planned dividing lines is placed on a placement table and a water tank allows the wafer placed on the placement table to be submerged in cleaning water. An ultrasonic supply unit supplies ultrasonic waves to the wafer submerged in the cleaning water. By the ultrasonic waves supplied by the ultrasonic supply unit, the wafer is divided along the planned dividing lines and is turned into small pieces to generate plural chips and the generated chips are cleaned.

3 Claims, 7 Drawing Sheets

WAFER PROCESSING APPARATUS

BACKGROUND OF THE INVENTION

Field of the Invention

The present invention relates to a wafer processing apparatus to divide a wafer.

Description of the Related Art

As a method for dividing a wafer, the following method has been proposed. Specifically, a modified layer is formed inside a workpiece by irradiating a wafer with a pulsed laser beam having capability of transmission through the wafer, with the light focus point set inside the area along which dividing should be performed. Thereafter, the wafer is divided by applying an external force to the wafer along planned dividing lines, along which the strength is lowered due to the forming of the modified layer (refer to e.g. Japanese Patent Laid-Open No. 2002-192367). As a method for applying the external force to the wafer in which the modified layer has been formed, there has been proposed a method in which the wafer is disposed in a liquid tank and ultrasonic waves generated by an ultrasonic oscillator are made to act on the wafer (refer to e.g. Japanese Patent Laid-Open No. 2005-135964).

SUMMARY OF THE INVENTION

However, in the methods of the related arts, the wafer is not divided by merely forming the modified layer in the wafer and an external force needs to be applied to the wafer along the planned dividing lines, along which the modified layer is formed. Therefore, there is a problem that the productivity is low. Furthermore, when the wafer is divided by applying the external force thereto, dividing dust is generated by the dividing and therefore the generated dividing dust needs to be removed. However, when blowing off the dividing dust is attempted by e.g. injecting air from a nozzle, possibly divided chips are also blown off.

It is therefore an object of the present invention to efficiently divide a wafer in which a modified layer has been formed and remove dividing dust without blowing off chips.

In accordance with an aspect of the present invention, there is provided a wafer processing apparatus to divide a wafer. The wafer processing apparatus includes a placement table on which the wafer is placed. A modified layer has been formed inside the wafer by irradiating the wafer with pulsed laser beam having such a wavelength as to be transmitted through the wafer along planned dividing lines, with a light focus point positioned inside the wafer. The wafer processing apparatus further includes a water tank for submerging the wafer placed on the placement table in cleaning water and an ultrasonic supply means that supplies ultrasonic waves to the wafer submerged in the cleaning water. By the ultrasonic waves supplied by the ultrasonic supply means, the wafer is divided along the planned dividing lines and is turned into small pieces to generate a plurality of chips and the generated chips are cleaned.

Preferably, the ultrasonic supply means includes an ultrasonic oscillator that generates ultrasonic waves and a variator that changes the frequency and output power of the ultrasonic waves generated by the ultrasonic oscillator. Furthermore, the variator sets the frequency and output power of the ultrasonic waves generated by the ultrasonic oscillator in cleaning of the chips to frequency and output power different from the frequency and output power of the ultrasonic waves generated by the ultrasonic oscillator in dividing of the wafer.

Preferably, the placement table has a through-hole vertically penetrating a placement surface on which the wafer is placed. Furthermore, the ultrasonic supply means has an ultrasonic oscillator disposed separately from the placement surface of the placement table below the placement surface, and ultrasonic waves generated by the ultrasonic oscillator pass through the through-hole to be supplied to the wafer from the lower surface side.

Preferably, the ultrasonic supply means has an ultrasonic oscillator disposed in contact with a water surface in the water tank above the placement table, and ultrasonic waves generated by the ultrasonic oscillator are supplied to the wafer from the upper surface side.

Preferably, the placement table has a through-hole vertically penetrating a placement surface on which the wafer is placed, and the ultrasonic supply means includes a first ultrasonic oscillator disposed separately from the placement surface of the placement table below the placement surface and a second ultrasonic oscillator disposed in contact with a water surface in the water tank above the placement table. Furthermore, ultrasonic waves generated by the first ultrasonic oscillator pass through the through-hole to be supplied to the wafer from the lower surface side and ultrasonic waves generated by the second ultrasonic oscillator are supplied to the wafer from the upper surface side.

In the wafer processing apparatus according to the present invention, the wafer is submerged in the cleaning water and ultrasonic waves are supplied thereto. Thus, the wafer can be efficiently divided along the planned dividing lines and dividing dust generated by the dividing can be removed by cleaning. The optimum frequency and output power for the dividing are different from the optimum frequency and output power for the cleaning. Therefore, if the variator that changes the frequency and output power of the ultrasonic waves generated by the ultrasonic oscillator is provided, the dividing and the cleaning can be efficiently carried out when ultrasonic waves with frequency and output power different between in the dividing and in the cleaning are supplied.

If the through-hole is made in the placement surface of the placement table and the ultrasonic oscillator is disposed separately from the placement surface of the placement table below the placement surface, dividing dust can be made to drop through the through-hole and thus the cleaning effect is enhanced. If the ultrasonic oscillator is provided over the placement table, dividing dust that drops from the wafer is not deposited on the ultrasonic oscillator and thus the cleaning effect is enhanced.

If ultrasonic waves generated by the first ultrasonic oscillator pass through the through-hole to be supplied to the wafer from the lower surface side and ultrasonic waves generated by the second ultrasonic oscillator are supplied to the wafer from the upper surface side, so that the ultrasonic waves are supplied to both the upper and lower surfaces of the wafer, the ultrasonic waves efficiently act on the wafer and thus the wafer can be surely divided.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
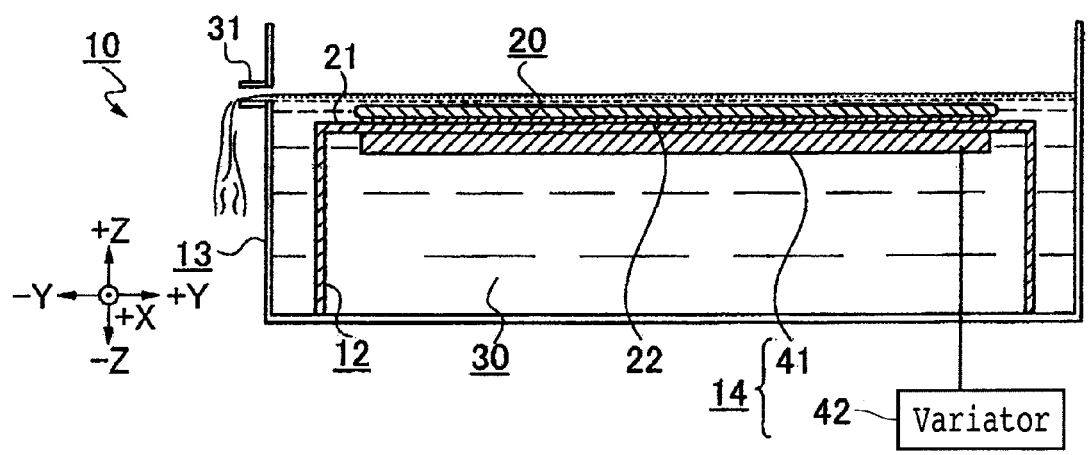
FIG. 1 is a side sectional view showing a first wafer processing apparatus.

A wafer processing apparatus 10 shown in FIG. 1 includes a placement table 12 on which a wafer 20 is placed, a water tank 13 for submerging the wafer 20 placed on the placement table 12 in cleaning water 30, and an ultrasonic supply unit 14 that supplies ultrasonic waves to the wafer 20 submerged in the cleaning water 30. The wafer 20 is partitioned by planned dividing lines and devices are formed in the respective areas defined by the partitioning on the front surface. Plural chips are generated by dividing the wafer 20 along the planned dividing lines to turn it into small pieces. A protective tape 22 is attached to the front surface for device protection.

Inside the wafer 20 placed on the placement table 12, a modified layer is formed along the planned dividing lines. The modified layer is formed by irradiating the wafer 20 with pulsed laser beam having such a wavelength as to be transmitted through the wafer 20 (e.g. in the infrared region) along the planned dividing lines, with the light focus point positioned inside the wafer 20, as described in e.g. Japanese Patent Laid-Open No. 2002-192367.

The placement table 12 has a placement surface 21 parallel to the XY-plane. The wafer 20 is placed on the placement surface 21. The placement table 12 is disposed in the water tank 13. It is enough that the placement table 12 is an object on which the wafer 20 is placed, and the placement table 12 may be so configured as not to hold the placed wafer 20 or may be so configured as to hold it. Furthermore, the placement table 12 may be an object that rotates the held wafer 20.

To the water tank 13, the cleaning water 30 is supplied from a cleaning water supply source (not shown). The water tank 13 has a drain outlet 31 for draining the cleaning water 30. The drain outlet 31 is disposed at a position that is higher than the placement surface 21 of the placement table 12 and is higher than the upper surface of the wafer 20 placed on the placement surface 21. This submerges the wafer 20 placed on the placement surface 21 in the cleaning water 30. The new cleaning water 30 is supplied from the cleaning water supply source, not shown, to the water tank 13 and the old cleaning water 30 is drained from the drain outlet 31.

The ultrasonic supply unit 14 includes an ultrasonic oscillator 41 that generates ultrasonic waves and a variator 42 that changes the frequency and output intensity of ultrasonic waves generated by the ultrasonic oscillator 41. The ultrasonic oscillator 41 is fixed to the surface on the lower side of the placement surface 21 (-Z side) and ultrasonic waves generated by the ultrasonic oscillator 41 vibrate the placement surface 21 and act on the wafer 20 placed on the placement surface 21 from the lower side.

Next, the operation of the wafer processing apparatus 10 will be described. First, the wafer 20 having devices formed on its front surface, a modified layer formed inside, and the protective tape 22 attached to the front surface is placed on the placement surface 21. As the orientation of the placement of the wafer 20, the surface to which the protective tape 22 is attached may be oriented upward or the surface to which the protective tape 22 is not attached may be oriented upward.

Next, the ultrasonic oscillator 41 generates ultrasonic waves. The variator 42 controls the ultrasonic oscillator 41 so that the ultrasonic waves generated by the ultrasonic oscillator 41 may have the optimum frequency and output intensity to divide the wafer 20. The ultrasonic waves generated by the ultrasonic oscillator 41 act on the wafer 20 from the lower side via the placement surface 21. For example, the frequency is set to 20 to 50 kHz and the output power is set to 500 to 1000 W, so that vibration is given to the wafer 20 by using ultrasonic waves having high output power and large amplitude. Due to application of an external force by the ultrasonic waves, a break is so caused that the modified layer, at which the strength is low, is the origin and the wafer 20 is divided along the planned dividing lines to be turned into small pieces, so that plural chips are generated.

Next, the variator 42 controls the ultrasonic oscillator 41 so that the ultrasonic waves generated by the ultrasonic oscillator 41 may have the optimum frequency and output intensity to clean the wafer 20 differently from in the dividing. Therefore, the generated chips (particularly, groove parts along which the break is caused) are cleaned and dividing dust generated by the dividing is removed. The removed dividing dust is discharged from the drain outlet 31 together with the cleaning water 30. For example, the frequency is set to 100 to 500 kHz to be set higher than that in the dividing and the output power is set to 200 to 1000 W to be set lower than or equivalent to that in the dividing. Therefore, only the dividing dust is vibrated with comparatively small amplitude to be removed from the wafer 20.

By submerging the wafer 20 in the cleaning water 30 and supplying ultrasonic waves in this manner, the wafer 20 can be efficiently divided because an external force by the ultrasonic waves acts on the whole of the wafer 20. In particular, in the case of a multi-chip on which devices different in size exist in a mixed manner, a planned dividing line that is short in length exists. Therefore, when an external force is applied by extending a dicing tape attached to the wafer, the short planned dividing line is not successfully divided in some cases. However, if an external force is applied by ultrasonic waves, the short planned dividing line can also be surely divided. Furthermore, because the wafer 20 is submerged in the cleaning water 30, the dividing dust generated by the dividing is removed by the cleaning water 30. Moreover, the cleaning effect is enhanced by ultrasonic waves and thus the dividing dust is surely removed. Differently from the case of cleaning the wafer by blowing fluid from a nozzle such as an air nozzle, water nozzle, or ultrasonic cleaning nozzle, the chips obtained as small pieces by the dividing are not blown off.

The variator 42 may be absent if a configuration is employed in which the frequency and output power of ultrasonic waves are not changed between in the dividing and in the cleaning and the dividing and the cleaning are carried out with the same frequency and output power. However, the optimum frequency and output power for the dividing are different from the optimum frequency and output power for the cleaning. Therefore, it is preferable to provide the variator 42 and change the frequency and output power of ultrasonic waves between in the dividing and in the cleaning.

Figure 2:
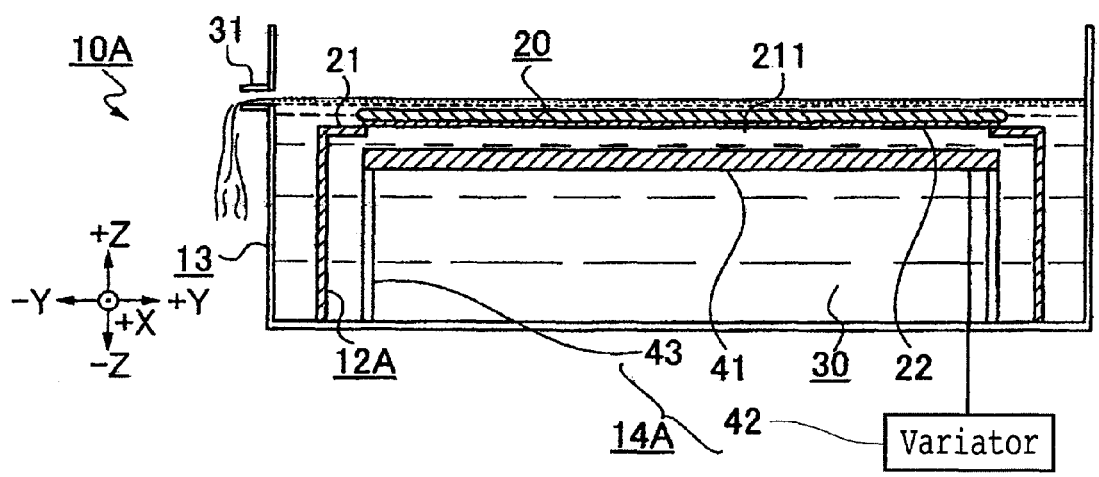
FIG. 2 is a side sectional view showing a second wafer processing apparatus.

In a wafer processing apparatus 10A shown in FIG. 2, the configuration of a placement table 12A and an ultrasonic supply unit 14A is different from the placement table 12 and the ultrasonic supply unit 14 in the wafer processing apparatus 10 shown in FIG. 1. The placement table 12A has a through-hole 211 vertically penetrating the placement surface 21 on which to place the wafer 20. The inner diameter of the through-hole 211 is somewhat smaller than the outer diameter of the wafer 20. Therefore, when the wafer 20 is placed on the placement surface 21, a state in which most part of the lower surface of the wafer 20 is exposed in the cleaning water 30 is obtained.

The ultrasonic supply unit 14A has support portions 43 that support the ultrasonic oscillator 41 in addition to the ultrasonic oscillator 41 and the variator 42. The ultrasonic oscillator 41 is supported by the support portions 43 and is disposed separately from the placement surface 21 below the placement table 12A. Ultrasonic waves generated by the ultrasonic oscillator 41 travel in the cleaning water 30 and pass through the through-hole 211 to act on the wafer 20 from the lower side.

Figure 3:
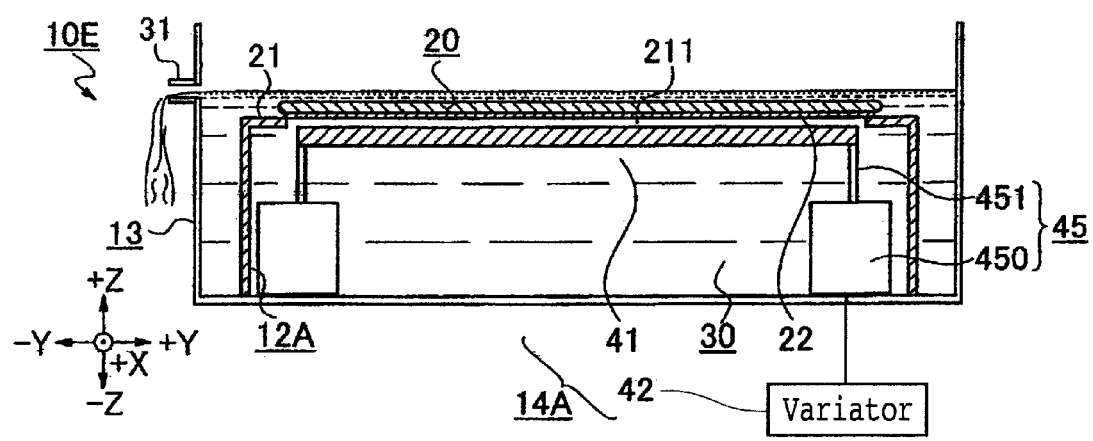
FIG. 3 is a side sectional view showing a modification example of the second wafer processing apparatus.
Figure 4:
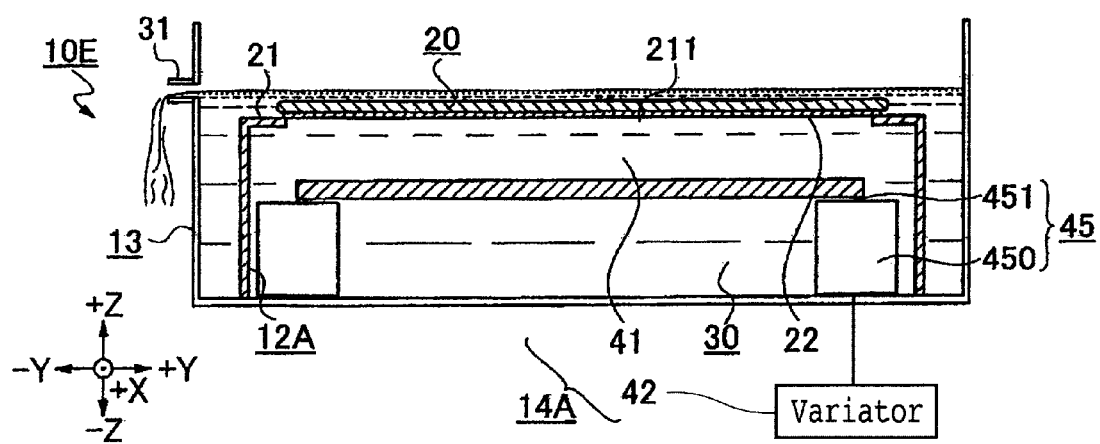
FIG. 4 is a side sectional view showing the operation of the modification example of the second wafer processing apparatus.

The variator 42 controls the ultrasonic oscillator 41 so that the ultrasonic waves generated by the ultrasonic oscillator 41 may have the optimum frequency and output intensity to divide the wafer 20. The output power of the ultrasonic waves can be adjusted also by the following configuration. Specifically, as in a wafer processing apparatus 10E shown in FIG. 3, a raising/lowering unit 45 to raise and lower the ultrasonic oscillator 41 is provided. By this raising/lowering unit 45, the distance between the ultrasonic oscillator 41 and the wafer 20 is adjusted e.g. by, as shown in FIG. 4, lowering the ultrasonic oscillator 41 to make it get further from the wafer 20. The raising/lowering unit 45 is formed of e.g. a unit composed of cylinders 450 and raising/lowering rods 451 as in the example shown in FIGS. 3 and 4 or a unit including a raising/lowering motor. The orientation of the placement of the wafer 20 on the placement surface 21 may be either orientation. However, when the surface to which the protective tape 22 is attached is oriented upward, dividing dust passes through the through-hole 211 to drop down and thus the cleaning effect is enhanced.

Figure 5:
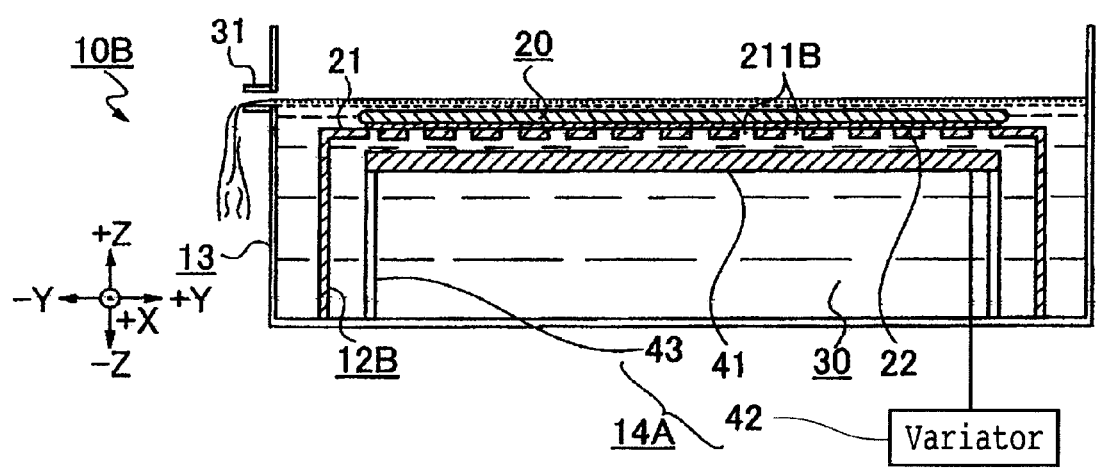
FIG. 5 is a side sectional view showing a third wafer processing apparatus.

In a wafer processing apparatus 10B shown in FIG. 5, the configuration of a placement table 12B is different from the placement table 12A of the wafer processing apparatus 10A shown in FIG. 2. The placement table 12B has a large number of through-holes 211B vertically penetrating the placement surface 21. The inner diameter of the through-hole 211B is sufficiently smaller than the outer diameter of the wafer 20. Therefore, even when the position of the wafer 20 placed on the placement surface 21 is somewhat offset, the wafer 20 does not drop through the through-hole 211B.

Ultrasonic waves generated by the ultrasonic oscillator 41 travel in the cleaning water 30 and pass through the through-holes 211B to act on the parts exposed through the through-holes 211B. In addition, the ultrasonic waves vibrate the placement surface 21 to act also on the parts that are not exposed through the through-holes 211B. Furthermore, if the wafer 20 is placed on the placement surface 21 with the surface to which the protective tape 22 is attached oriented upward, dividing dust passes through the through-holes 211B to drop down and thus the cleaning effect is enhanced.

Also in the wafer processing apparatus 10B shown in FIG. 5, the variator 42 controls the ultrasonic oscillator 41 so that the ultrasonic waves generated by the ultrasonic oscillator 41 may have the optimum frequency and output intensity to divide the wafer 20. As shown in FIGS. 3 and 4, the ultrasonic oscillator 41 may be allowed to be raised and lowered and the output power of ultrasonic waves may be allowed to be adjusted by adjusting the distance between the ultrasonic oscillator 41 and the wafer 20.

Figure 6:
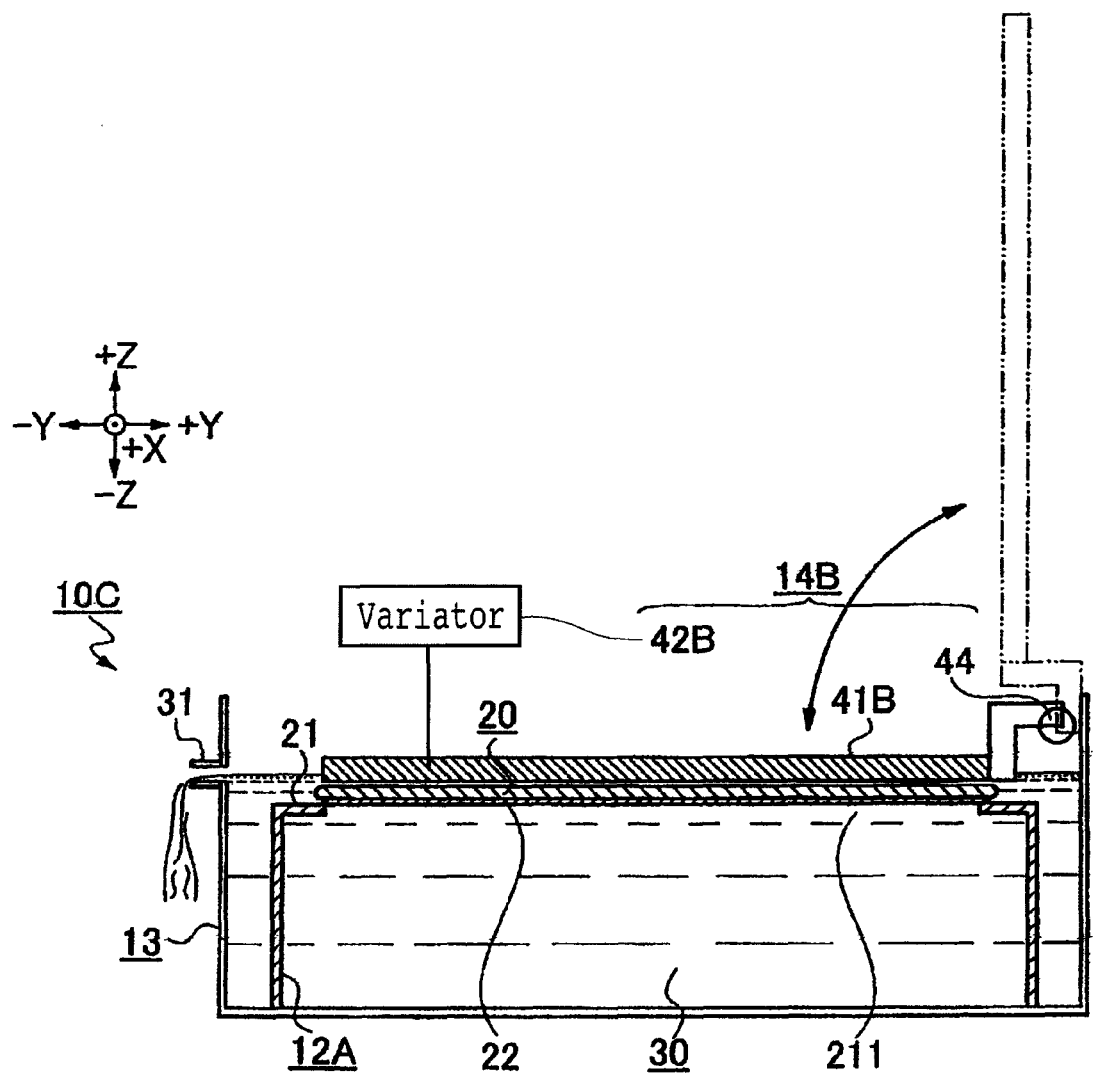
FIG. 6 is a side sectional view showing a fourth wafer processing apparatus.

In a wafer processing apparatus 10C shown in FIG. 6, the configuration of an ultrasonic supply unit 14B is different from the ultrasonic supply unit 14A of the wafer processing apparatus 10A shown in FIG. 2. The ultrasonic supply unit 14B has a support portion 44 that supports an ultrasonic oscillator 41B in addition to the ultrasonic oscillator 41B and a variator 42B. The support portion 44 supports the ultrasonic oscillator 41B in such a manner that the ultrasonic oscillator 41B can pivot about a support shaft parallel to the ±X-directions. By causing the ultrasonic oscillator 41B to pivot and setting it at a position shown by a solid line in the diagram, the ultrasonic oscillator 41B is disposed in contact with the water surface of the cleaning water 30 in the water tank 13.

Specifically, the ultrasonic oscillator 41B is disposed in contact with the water surface above the placement table 12A and the lower surface of the ultrasonic oscillator 41B is located on the lower side relative to the water surface. A configuration in which the whole of the ultrasonic oscillator 41B is submerged in the cleaning water 30 may be employed or a configuration in which the upper surface of the ultrasonic oscillator 41B is located on the upper side relative to the water surface may be employed. Furthermore, the ultrasonic oscillator 41B may be so configured as to be in tight contact with the upper surface of the wafer 20 placed on the placement surface 21 or may be so configured as to be separate from the wafer 20. Ultrasonic waves generated by the ultrasonic oscillator 41B act on the wafer 20 from the upper surface side directly or after traveling in the cleaning water 30.

By causing the ultrasonic oscillator 41B to pivot and raising it to a position indicated by a two-dotted chain line in the diagram, the wafer 20 can be placed on the placement surface 21 and the wafer 20 for which dividing and cleaning have been completed can be removed from the placement surface 21. If the wafer 20 is placed on the placement surface 21 with the surface to which the protective tape 22 is attached oriented upward, dividing dust passes through the through-hole 211 to drop down. Because the ultrasonic oscillator 41B is disposed on the upper side of the wafer 20, the dividing dust that drops down through the through-hole 211 is not deposited on the ultrasonic oscillator 41B and drops in the water tank 13. This can enhance the cleaning effect.

Figure 7:
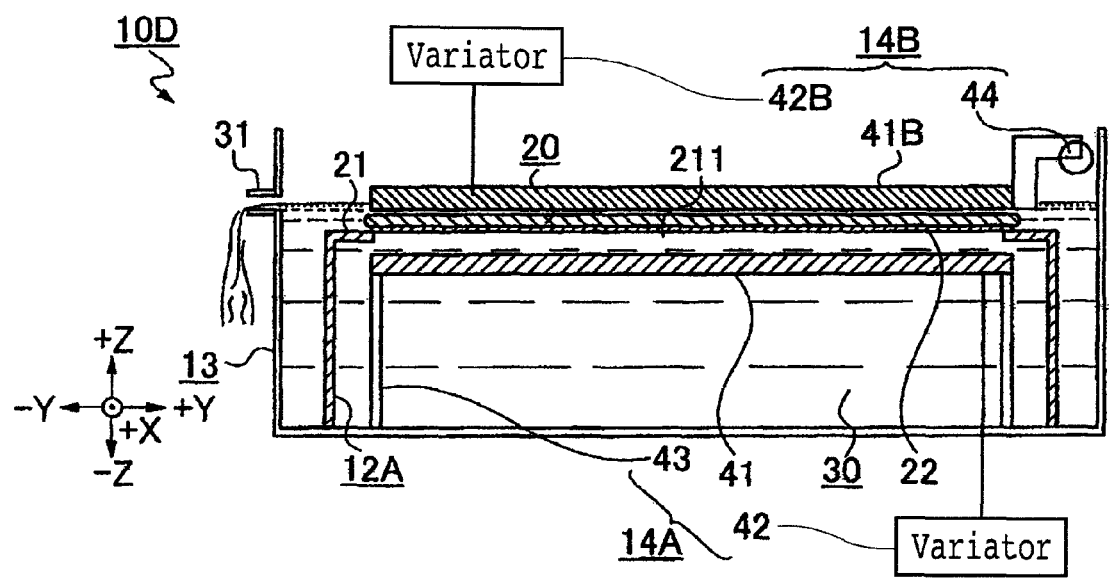
FIG. 7 is a side sectional view showing a fifth wafer processing apparatus.

A wafer processing apparatus 10D shown in FIG. 7 has, in addition to the wafer processing apparatus 10A shown in FIG. 2, the ultrasonic supply unit 14B of the wafer processing apparatus 10C shown in FIG. 6. Thus, the wafer processing apparatus 10D has two ultrasonic supply units 14A and 14B in total. The placement table 12A has the through-hole 211 vertically penetrating the placement surface 21. The ultrasonic supply unit 14A includes the first ultrasonic oscillator 41 disposed separately from the placement surface 21 below the placement surface 21 and the second ultrasonic oscillator 41B disposed in contact with the water surface in the water tank above the placement table 12A.

Ultrasonic waves generated by the first ultrasonic oscillator 41 of the ultrasonic supply unit 14A pass through the through-hole 211 to act on the wafer 20 from the lower surface side. Furthermore, ultrasonic waves generated by the second ultrasonic oscillator 41B of the ultrasonic supply unit 14B act on the wafer 20 from the upper surface side. By causing the ultrasonic waves to act on the wafer 20 from both the upper and lower surfaces thereof, the external force applied to the wafer 20 is intensified and the wafer 20 can be surely divided. A configuration may be employed in which the ultrasonic supply unit 14B does not have the variator 42B and the variator 42 of the ultrasonic supply unit 14A changes the frequency and output power of the ultrasonic waves generated by the ultrasonic oscillator 41B.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing apparatus to divide a wafer, comprising:
    a placement table on which the wafer is placed, a modified layer having been formed inside the wafer by irradiating the wafer with pulsed laser beam having such a wavelength as to be transmitted through the wafer along planned dividing lines, with a light focus point positioned inside the wafer;
    a water tank for submerging the wafer placed on the placement table in cleaning water; and
    an ultrasonic supply means that supplies ultrasonic waves to the wafer submerged in the cleaning water,
    wherein the ultrasonic supply means includes an ultrasonic oscillator that is disposed in contact with a water surface in the water tank above the placement table, and ultrasonic waves generated by the ultrasonic oscillator are supplied to the wafer from an upper surface side,
    a variator that changes frequency and output power of the ultrasonic waves generated by the ultrasonic oscillator,
    wherein the variator sets frequency and output power of the ultrasonic waves generated by the ultrasonic oscillator in cleaning of the chips to frequency and output power different from frequency and output power of the ultrasonic waves generated by the ultrasonic oscillator in dividing of the wafer, and
    wherein by the ultrasonic waves supplied by the ultrasonic supply means, the wafer is divided along the planned dividing lines and is turned into small pieces to generate a plurality of chips and the generated chips are cleaned.

2. The wafer processing apparatus according to claim 1, wherein the placement table has a through-hole vertically penetrating a placement surface on which the wafer is placed,
    the ultrasonic supply means has an ultrasonic oscillator disposed separately from the placement surface of the placement table below the placement surface, and
    ultrasonic waves generated by the ultrasonic oscillator pass through the through-hole to be supplied to the wafer from a lower surface side.

3. A wafer processing apparatus to divide a wafer, comprising:
    a placement table on which the wafer is placed, a modified layer having been formed inside the wafer by irradiating the wafer with pulsed laser beam having such a wavelength as to be transmitted through the wafer along planned dividing lines, with a light focus point positioned inside the wafer;
    a water tank for submerging the wafer placed on the placement table in cleaning water; and
    an ultrasonic supply means including
    a first ultrasonic oscillator disposed separately from the placement surface of the placement table below the placement surface, and
    a second ultrasonic oscillator disposed in contact with a water surface in the water tank above the placement table,
    a variator that changes frequency and output power of the ultrasonic waves generated by the ultrasonic oscillator,
    wherein the placement table has a through-hole vertically penetrating a placement surface on which the wafer is placed, and ultrasonic waves generated by the first ultrasonic oscillator pass through the through-hole to be supplied to the wafer from a lower surface side and ultrasonic waves generated by the second ultrasonic oscillator are supplied to the wafer from an upper surface side,
    wherein the variator sets frequency and output power of the ultrasonic waves generated by the ultrasonic oscillator in cleaning of the chips to frequency and output power different from frequency and output power of the ultrasonic waves generated by the ultrasonic oscillator in dividing of the wafer; and
    wherein by the ultrasonic waves supplied by the ultrasonic supply means, the wafer is divided along the planned dividing lines and is turned into small pieces to generate a plurality of chips and the generated chips are cleaned.

* * * * *